United States Patent [19]

Cruzan et al.

[11] 3,943,047

[45] Mar. 9, 1976

[54] SELECTIVE REMOVAL OF MATERIAL BY SPUTTER ETCHING

[75] Inventors: Paul David Cruzan, Allentown, Pa.; Thomas Charles Tisone, Schaumburg, Ill.

[73] Assignee: Bell Telephone Laboratories, Incorporated, Murray Hill, N.J.

[22] Filed: May 10, 1974

[21] Appl. No.: 468,813

[52] U.S. Cl. .............................. 204/192; 204/298
[51] Int. Cl.² ...................................... C23C 15/00
[58] Field of Search ............... 204/192, 298, 297 R; 117/93.3, 93.1 GB; 156/7, 8, 17; 96/36.2; 252/79.1

[56] References Cited
UNITED STATES PATENTS

| 3,325,393 | 6/1967 | Darrow et al. | 204/192 |
|---|---|---|---|
| 3,361,659 | 1/1968 | Bertelsen | 204/192 |
| 3,410,775 | 11/1968 | Vratny | 204/192 |
| 3,526,584 | 9/1970 | Shaw | 204/192 |
| 3,558,351 | 1/1971 | Foster | 117/201 |
| 3,661,760 | 5/1972 | Borgne et al. | 204/298 |
| 3,699,034 | 10/1972 | Lins et al. | 204/192 |
| 3,730,873 | 5/1973 | Pompei et al. | 204/298 |
| 3,820,994 | 6/1974 | Lindberg et al. | 156/17 X |

*Primary Examiner*—Howard S. Williams
*Assistant Examiner*—Aaron Weisstuch
*Attorney, Agent, or Firm*—H. W. Lockhart

[57] ABSTRACT

During the removal of material selectively, by the sputter etching of the surface of a semiconductor wafer, the wafer is moved so as to produce a continuously varying angle of incidence between the ion beam and the wafer surface. There is also provided a field-free region adjoining the surface of the wafer which is being etched. As a consequence, the sputtering beam strikes the wafer surface over a range of angles which results in more complete removal of material, particularly material overlying stepped portions of the surface.

2 Claims, 3 Drawing Figures

SELECTIVE REMOVAL OF MATERIAL BY SPUTTER ETCHING

This invention relates to sputter etching and more particularly, to selective removal of material from the surface of a workpiece by sputter etching using suitable masking layers.

BACKGROUND OF THE INVENTION

Sputter etching for selective removal of material from the surface of substrates, particularly those used for microelectronics apparatus, is already in considerable use. The practice is, in effect, a reversal of the previously well-known art of sputter deposition and involves simply a reversal of roles so that the target being etched replaces the customary source of material being deposited. Sputter etching has numerous advantages and particularly is regarded as enabling a high degree of definition when applied to selective removal processes using suitable masking layers of material which are more impervious to sputter etching and therefore protect underlying material. In particular, sputter etching generally involves a particle or ion beam incident perpendicularly upon the substrate surface. For many configurations, this provides a satisfactory result with relatively sharply defined perpendicular sidewalls as defined by the masking layer particularly where the material being removed is part of, or overlies, a layer of uniform thickness and where the portion being removed has a lateral, or width, dimension, which is large relative to its height. Because it is in the nature of the sputter etching process for redeposition of sputtered material to occur, there is a tendency in the case of patterns having narrow line widths to form virtual steps as a consequence.

Thus, where the topography of the patterned material on a substrate, typically a semiconductor body, comprises underlying layers having different thicknesses so that the underlying layer includes steps from one level to another, as well as for patterns having narrow line widths, the usual sputter etch procedure does not remove overlying material completely from the inside corners of the pattern. Consequently subsequent depositions and material removals depart from the desired degree of pattern definition as a consequence of such inadequate etching procedure.

Accordingly, an object of this invention is a method for insuring more complete removal of unmasked material by sputter etching.

SUMMARY OF THE INVENTION

In accordance with a particular embodiment of this invention, a workpiece, for example a semiconductor wafer, is supported in a suitable holder in a sputter etching apparatus so that the face to be etched is directed toward the ion beam. During the application of the beam, the holder in which the wafer is supported is tilted relative to the beam direction and is rotated about an axis perpendicular to the plane of the wafer. It is also in accordance with the method of this invention to use a field-free region adjoining the surface of the wafer so that the beam particles move in straight lines to impinge upon the wafer surface at an angle of incidence determined essentially by the angle between the beam axis and the surface of the wafer.

Another form of movement may be imparted to the wafer by oscillating the support member for the shaft and holder assembly through an arc traversing the ion beam. This further varies the range of the angle of incidence of the beam upon the wafer surface. In a typical instance, the loci of the angles of incidence may be defined within a cone or frustrum of a cone, with its apex or top at the wafer surface.

As a consequence of this method of applying the sputtering beam to the wafer surface, the vertical portions of the unmasked layer are exposed to a beam striking from the side at varying angles rather than simply from the top horizontal surface. As a result, there is a more complete removal of material from the inside corner portions of the pattern.

BRIEF DESCRIPTION OF THE DRAWING

The invention and its objects and features may be more clearly understood from the following detailed description taken in conjunction with the drawing in which.

DETAILED DESCRIPTION

Figure 1:
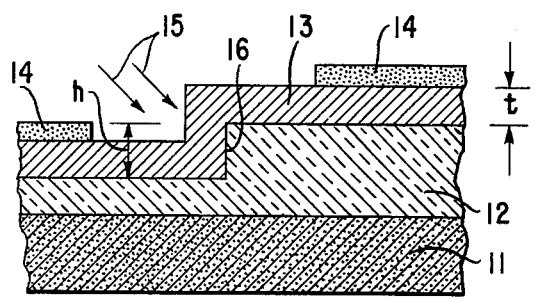
FIG. 1 is a schematic view in section of a surface portion of a silicon semiconductor body having a stepped metal film thereon.

One aspect of the problem to which this invention is directed may be better understood by reference to the structure shown in FIG. 1. This sectional view shows a silicon semiconductor substrate 11 having a layer 12 of silicon dioxide thereon having two different thicknesses. Overlying the silicon dioxide layer is a metal film 13, and overlying portions of the metal film 13 is a masking layer 14 which is relatively impervious or, at least, more resistant to sputter etching than is the metal layer 13. The metal layer has a thickness $t$ which defines the depth to be removed by the beam impinging perpendicular to the semiconductor surface. However, in the region of the step 16 between the different thicknesses of the silicon dioxide layer 12 there is a thickness of the metal film 13 denoted as $h$ to be removed in addition to the overlying thickness $t$. If, in order to remove this additional thickness of metal, the sputter etching is continued for a sufficiently longer time, the result may be the unwanted removal of other materials including the masking layer 14 itself, thus exposing underlying layers to the action of the sputtering beam.

However, in accordance with this invention, a method is provided so that the ion beam impinges upon a wafer surface at varying angles including those represented by the arrows 15 which indicate the beam impinging upon the vertical sidewall of the stepped portion. It has been found that by providing a beam incident against this sidewall, the vertical portions of the steps, including inside corners of material, can be completely removed during a time comparable to that required for removal of the uniform metal layer of thickness $t$.

Figure 2:
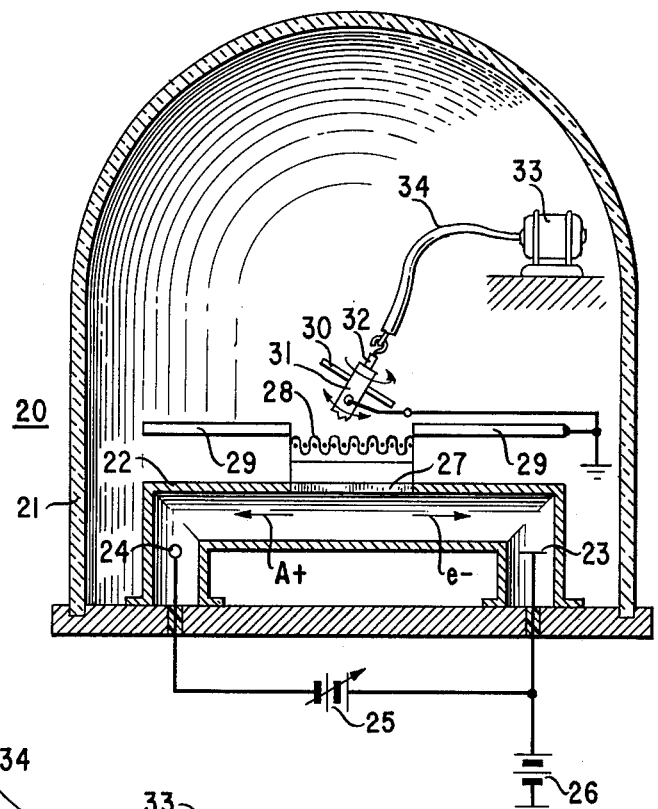
FIG. 2 is a simplified schematic view depicting apparatus used for the sputter etching method of this invention.

In accordance with the method of this invention, there is provided apparatus as shown in FIG. 2 which includes a standard vacuum chamber 21 housing a plasma confinement tube 22 containing an anode 23 and a cathode 24 at opposite ends thereof. The confinement tube has a single opening 27 over which there is provided a screen 28 which is insulated from the confinement tube 22 and is connected electrically to ground. The screen 28 functions as an accelerating grid. The target comprises one or more semiconductor wafers mounted in the holder 30 located above the accelerating grid and tilted at an angle relative to the direction of the beam emitted from the tube opening 27 and through the accelerating grid 28. A suitable angle of tilt is from a few degrees to about 60° depending on the geometric configuration of the pattern. The holder 30 is supported by a rotatable shaft 32 flexibly coupled by means of a shaft 34 to a prime mover 33. The shaft 32 is rotatably mounted in a yoke 31 which is supported from pivots so as to be capable of oscillating movement. Spaced away from the confinement tube 22 is an electrical shield 29 which is connected to ground and which insures the virtual absence of an electrical field from the region adjacent the target holder 30 and above the accelerating grid 28. Thus in accordance with this arrangement using any ionizable gas, such as argon, a plasma is generated within the confinement tube 22. Ions are emitted through the opening 27 from this plasma through the accelerating grid 28 into the field-free region in which their movement then is in substantially straight lines to impinge upon the surfaces of the semiconductor wafer targets.

Figure 3:
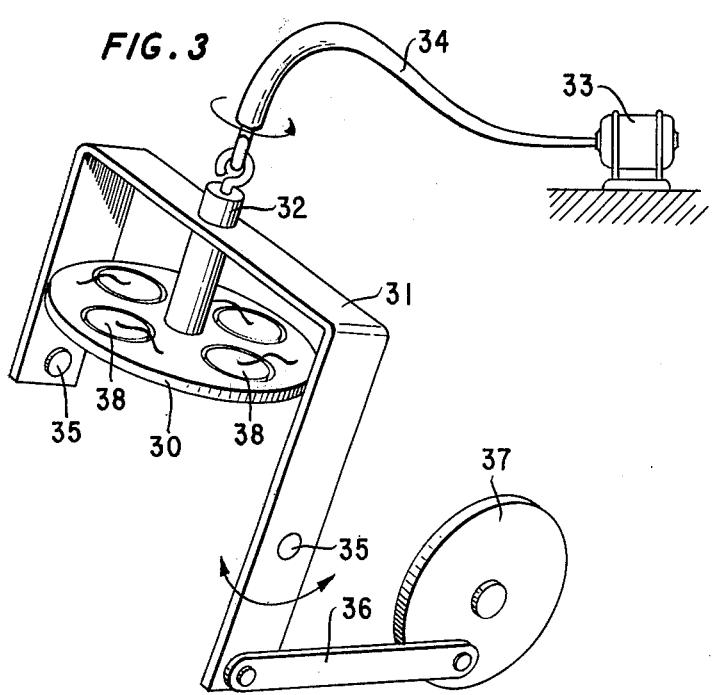
FIG. 3 is an enlarged view of a portion of the apparatus of FIG. 2 showing the rotating and oscillating holder.

Referring to FIG. 3, the arrangement for moving the semiconductor wafers within the ion beam is shown in more detail. The holder 30 may be of a type similar to that disclosed in the application of B. E. Nevis-T. C. Tisone Case 2-2 Ser. No. 468,812 now abandoned and replaced by Ser. No. 576,015, filed May 9, 1975 filed concurrently with this application. The wafers 38 are shown placed in the holder 30 with the surfaces to be etched facing downward. The holder 30 is attached to an axial shaft 32 rotatably supported in the yoke 31 and coupled by means of flexible shaft 34 to a prime mover 33. Inasmuch as the holder 30 is tilted at an angle from the plane perpendicular to the axis of the ion beam, rotation of the holder 30 results in a substantially varying angle of incidence of the beam against the wafer surface. In addition, by means of connecting rod 36 and driving member 37, the yoke 31 is oscillated about the pivots 35 providing additional variation in the angle of incidence of the ion beam. There is thus provided additional enhancement of material removal by this means.

The arrangements described above constitute one mode of implementing the method in accordance with this invention which comprises moving a substrate being sputter etched within the ion beam. It will be apparent to those skilled in the art that these are rudimentary and basic techniques and may be varied and provided in more elegant fashion to accomplish the same general purpose. What is significant to the method of this invention is the use of a field-free region to insure substantially straight line movement of the bombarding particles as they near and reach the target coupled with relative angular movement of the target surface with respect to the ion beam axis so as to produce a varying angle of beam incidence. Moreover, the field-free region may have the further advantageous effect that secondary electrons are not accelerated therein, thus avoiding certain forms of radiation damage to the target which may occur as a consequence.

The specific embodiment described above may be characterized as a relatively standard low voltage triode sputtering system. The anode 23 is biased positive relative to ground by the source 26 so that the arrangement behaves as an ion gun. The ions are accelerated through the opening 27 by the difference between the plasma potential produced by source 25 and the gun bias produced by source 26. In a particular embodiment the confinement tube opening 27 was varied in size to a maximum of 7.5 inches diameter with a d.c. current density of about two milliamperes per square centimeter using a plasma current of six amperes. Substantially larger guns appear to be completely feasible. The accelerating grid 28 was a screen over the opening 27 biased negative relative to the anode 23. The target structure likewise is connected to ground and therefore biased negative relative to anode 23.

As noted above, one important consideration in the method of this invention is the relative angular movement of the target surface with respect to the direction or axis of the ion beam. In the embodiment described, this relative movement is achieved by imparting movement in various forms to the target, in this case, a semiconductor wafer. The same effect may be achieved by holding the target fixed and imparting movement to the ion beam. Such an arrangement may be accomplished by means of various deflection coils or magnets by techniques generally known in the art. Moreover if increasing complexity is accepted, both the target and the beam may be moved to impart the desired angular scanning effect that is the basis of the method of this invention for insuring complete removal of stepped portions of unmasked layers on the workpiece. Accordingly, it will be understood that various means of implementing the method which is claimed as the invention herein may be devised by those skilled in the art, all of which will fall within the scope and spirit of the claims. Moreover, although the specific description is directed to a semiconductor substrate, workpieces of other materials and systems may be used subject only to their susceptibility to the sputtering process.

What is claimed is:

1. A method for the selective removal by sputter etching of material from the surface of a workpiece including at least one layer of material dissimilar from that of the workpiece comprising placing the workpiece in a low pressure ambient of a noble gas, ionizing the noble gas to form a plasma, providing an electrode for accelerating the ions of the gas plasma toward the surface of the workpiece thereby forming a stream of ions impinging on said surface of the workpiece, producing relative change in the angular relation between the surface of the workpiece and the axis of the stream of ions, by causing the plane of the surface of the workpiece to simultaneously rotate in and traverse an arc in oscillatory fashion across the stream of ions, and providing a fieldfree region adjoining the surface of said workpiece whereby the ions in said stream travel in substantially straight paths to impinge on said surface.

2. The method in accordance with claim 1 in which said workpiece is a semiconductor wafer.

* * * * *